United States Patent [19]

Nishiura et al.

[11] Patent Number: 5,276,370
[45] Date of Patent: Jan. 4, 1994

[54] MOS-TYPE SEMICONDUCTOR DEVICE DRIVE CIRCUIT

[75] Inventors: Masaharu Nishiura; Tatsuhiko Fujihira, both of Kanagawa, Japan

[73] Assignee: Fuji Electric Co., Ltd, Kanagawa, Japan

[21] Appl. No.: 896,583

[22] Filed: Jun. 10, 1992

[30] Foreign Application Priority Data

Jun. 12, 1991 [JP] Japan .................................. 3-139314

[51] Int. Cl.$^5$ .............................................. H03K 5/08
[52] U.S. Cl. .................................. 307/544; 307/542; 307/568; 307/572
[58] Field of Search .............. 307/542, 544, 568, 540, 307/557, 571, 572, 542.1, 491

[56] References Cited

U.S. PATENT DOCUMENTS

| | | | |
|---|---|---|---|
| 4,492,883 | 1/1985 | Janutka | 307/572 |
| 4,748,351 | 5/1988 | Barzegar | 307/572 |
| 5,001,373 | 3/1991 | Bator et al. | 307/542 |
| 5,153,453 | 10/1992 | Walters | 307/568 |

*Primary Examiner*—William L. Sikes
*Assistant Examiner*—Toan Tran
*Attorney, Agent, or Firm*—Finnegan, Henderson, Farabow, Garrett & Dunner

[57] ABSTRACT

A circuit for driving a MOS-type semiconductor device having a source, a gate, and a drain. The circuit includes a MOSFET including a source, a gate, and a drain which is connected through a control circuit to the gate of the MOS-type semiconductor device to be driven, a Zener diode, a diode connected to the Zener diode in reverse series between the gate and the drain of the MOSFET, and a resistor connected between the gate and the source of the MOSFET.

27 Claims, 5 Drawing Sheets

MOS-TYPE SEMICONDUCTOR DEVICE DRIVE CIRCUIT

BACKGROUND OF THE INVENTION

Field of the Invention

The present invention generally relates to a MOS-type semiconductor device drive circuit. In particular, the invention relates to a drive circuit in which either an inductive load or a resistive load may be connected on the low voltage side of a MOS-type semiconductor device so as to achieve high speed operation.

Discussion of the Related Art

Because power electronics products have recently been expanded in production, miniaturized in size, and enhanced in performance, special attention has been given to a MOS-type semiconductor device such as a power MOSFET, an insulation gate bipolar transistor (which is hereinafter referred to as IGBT) or the like, which is characterized by a high-speed switching performance and a low driving capability.

Figure 2:
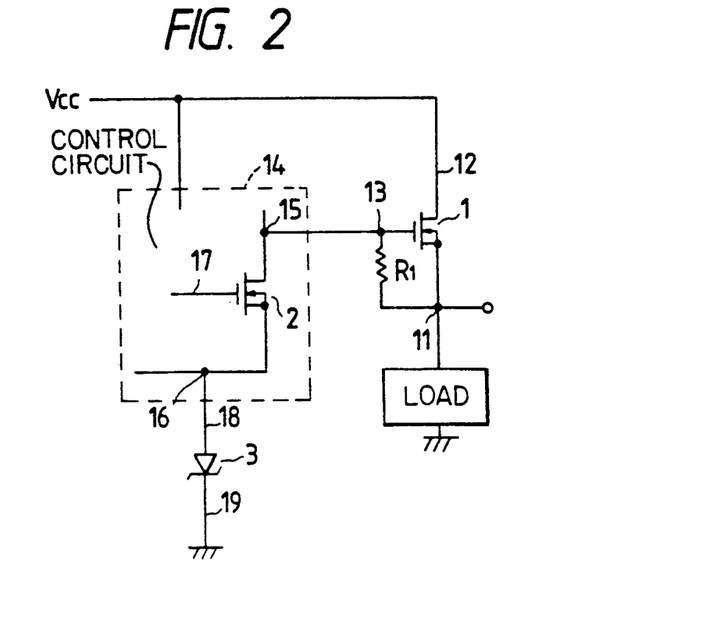
FIG. 2 is a circuit diagram of a conventional MOSFET drive circuit.

In FIG. 2, there is shown a drive circuit for driving a MOSFET according to the prior art. In this figure, a load (not shown) is connected to a source terminal 11 of MOSFET 1, a power supply is connected to a drain terminal 12 thereof, and a resistor $R_1$ is connected between a gate terminal 13 and source terminal 11 thereof. A control circuit 14, which is connected to gate terminal 13, includes a MOSFET 2 as a switching device. A drain terminal 15 of MOSFET 2 is connected to gate terminal 13 of MOSFET 1. A source terminal 16 of MOSFET 2 is connected to an anode terminal 18 of a Zener diode 3, and a cathode terminal 19 of Zener diode 3 is connected to a ground potential.

In order to turn on MOSFET 1 and allow a current to flow to the load connected to source terminal 11 of MOSFET 1 using the drive circuit, MOSFET 2 is turned off to increase the potential of gate terminal 13 to a high level. To turn off MOSFET 1 from this state, the potential of a gate terminal 17 of MOSFET 2 is raised higher than a threshold voltage to thereby turn on MOSFET 2, and the potential of gate terminal 13 is brought to ground potential. Simultaneously with this operation, current is passed through resistor $R_1$ and source terminal 11, resulting in a sudden drop in the potential of gate terminal 13. However, since the inductance of the load allows the current to continue to flow, even if the potential of gate terminal 13 reaches ground potential, current is still allowed to flow through resistor $R_1$ and the potential of gate terminal 13 is still lowered. If the potential of gate terminal 13 is lowered further, then, at a certain point, since Zener diode 3 causes a Zener breakdown, the potential is clamped and thus the current flowing through the load is reduced, thereby turning off MOSFET 1. In other words, according to the above conventional drive circuit, due to the fact that the potential of gate terminal 13 can be lowered to thereby reduce a time necessary for turning off MOSFET 1 in accordance with the current flowing through resistor $R_1$, a high-speed switching operation can be realized.

Figures 1, 3:
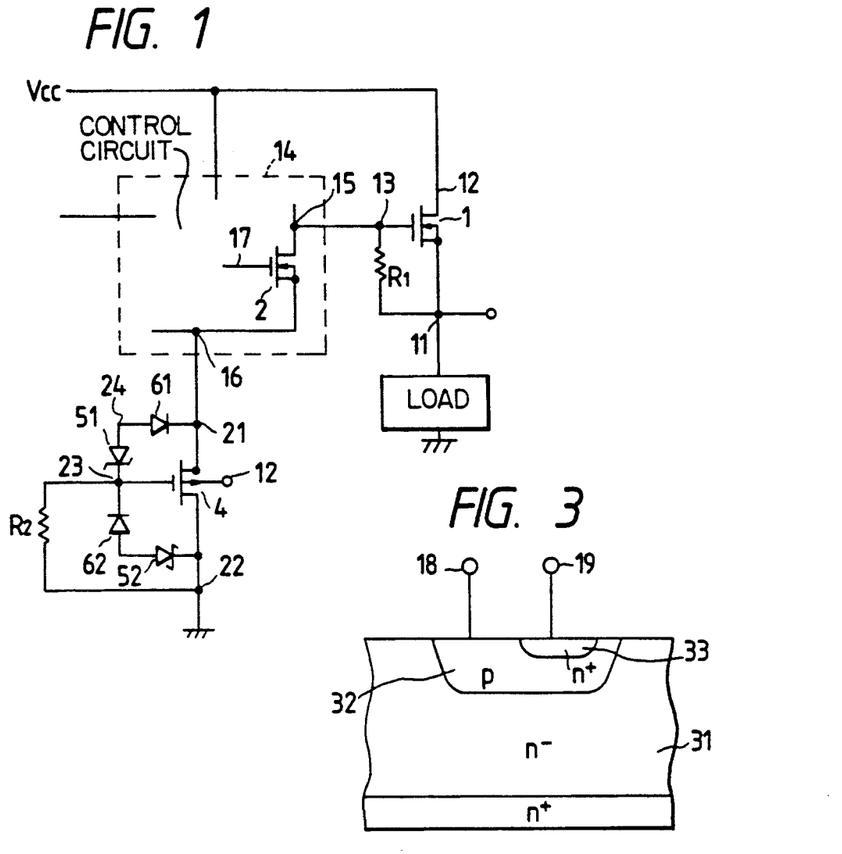
FIG. 1 is a circuit diagram of an embodiment of a MOSFET drive circuit according to the present invention.
FIG. 3 is a sectional view of a MOSFET substrate incorporating therein a Zener diode.
Figure 4:
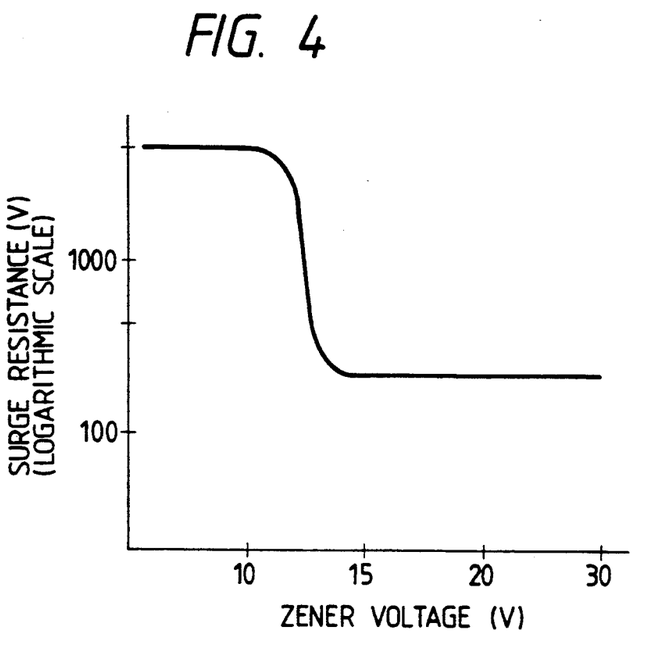
FIG. 4 is a graphical representation of a relation between the Zener voltage and surge resistance of the incorporated Zener diode.

In the above-mentioned turn-off operation, the voltage at which gate terminal 13 is clamped depends on the breakdown voltage of Zener diode 3, and at present a Zener diode of 10 to 20 V is proposed. When the clamp voltage becomes $-30$ V, $-40$ V, and $-50$ V, then the turn-off switching speeds are increased in accordance with these voltages. However, as shown in FIG. 3, when a p type layer 32 and an n+ type layer 33 are formed in a surface portion of an n− type layer 31 provided in a silicon substrate of a MOS-type semiconductor device, anode terminal 18 of Zener diode 3 as shown in FIG. 2 is connected to the surface of p type layer 32, and cathode terminal 19 is connected to n+ type layer 33, thereby providing a built-in Zener diode, the surge resistance of the Zener diode is lowered suddenly if the Zener voltage is increased. As shown in FIG. 4, this phenomenon is detectable in a practical measurement, although the reason for this is not known clearly.

In view of this, it has been considered to connect a plurality of Zener diodes in series in order to increase the clamp voltage. However, in this case, if a resistive load is connected to source terminal 11, then the potential of gate terminal 13 is determined only by a forward voltage across the serially connected Zener diodes, because the resistive load does not allow the current to flow on through resistor $R_1$ as does an inductive load. Therefore, the potential of gate terminal 13 is increased according to the number of the serially connected Zener diodes, which makes it impossible to turn off the Zener diodes quickly. That is, the serial connection results in reduced turn-off switching speed. Such a problem similarly arises when an IGBT is to be driven.

SUMMARY OF THE INVENTION

The present invention has been made in view of the above circumstances and has as an object to provide a MOS-type semiconductor device drive circuit which can allow the potential of the gate terminal thereof to drop even when a resistive load is connected, and which can arbitrarily set the clamp voltage of the gate terminal potential when an inductive load is connected, thereby providing high-speed switching operation.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the circuit of this invention for driving a MOS-type semiconductor device having a source, a gate, and a drain, comprises a MOSFET including a source, a gate, and a drain which is connected through a control circuit to the gate of the MOS-type semiconductor device to be driven, a Zener diode, a diode connected to the Zener diode in reverse series between the gate and the drain of the MOSFET, and a resistor connected between the gate and the source of the MOSFET.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

In order to achieve the above objects, according to the invention there is provided a MOS-type semiconductor device drive circuit including a MOSFET having a drain connected through a control circuit to the gate of the MOS-type semiconductor device to be driven, a Zener diode and a diode connected in reverse series between the gate and drain of the MOSFET, and a resistor connected between the gate and source thereof. In this embodiment, a resistor or a switching device is connected between the gate of the MOS-type semiconductor device to be driven and a terminal to which a load is connected. Also, according to another embodiment of the invention, there is provided a MOS-type semiconductor device drive circuit including a first transfer MOSFET connected to the gate of the MOS-type semiconductor device to be driven and also to a control circuit, a Zener diode and a diode are connected in reverse series between a source and drain of the first transfer MOSFET, second and third transfer MOSFETs are respectively connected between the source and gate of the first transfer MOSFET and between the gate and drain of the first transfer MOSFET, and a switching device is connected between the gate of the MOS-type semiconductor device to be driven and a terminal to which a load is connected. In another embodiment, a resistor can be effectively connected instead of the second transfer MOSFET, between the source and gate of the first transfer MOSFET.

When turning off one MOS-type semiconductor device which turns off another MOS-type semiconductor device turned on by a signal from a control circuit, gate electric charges are drawn out to a MOSFET by means of a switching device provided in the control circuit. The variations of a gate potential allowed to vary continuously when an inductive load is connected, are clamped by a Zener diode connected in parallel to the MOSFET. Even if the clamp voltage is set so that when an inductive load is connected the switching speed can be fast, there is eliminated a possibility that when a resistive load is connected the switching speed can be decreased. This is because the gate potential of a MOS-type semiconductor device to be driven is decreased down to the order of the threshold value of the MOSFET when the resistive load is connected.

In another embodiment, the first transfer MOSFET to be connected between the gate of the MOS-type semiconductor device to be driven and the control circuit, can be turned on by controlling the on/off operations of the second and third transfer MOSFETs that are respectively connected between the source and gate of the transfer MOSFET and between the gate and drain of the first transfer MOSFET. By means of the on/off control of the second and third transfer MOSFETs and also by turning on a MOSFET to be connected between the gate of the MOS-type semiconductor device to be driven and a terminal to which a load is connected, the gate potential of the MOS-type semiconductor device to be driven can be lowered so that the first transfer MOSFET can be turned off. In this operation, the gate electric charges are drawn out to the control circuit through the transfer MOSFET, while the variations of the gate potential continuing when an inductive load is connected, are clamped by a Zener diode connected in parallel to the transfer MOSFET. In this case, even if the clamp voltage is set so that when the inductive load is connected, the switching speed can be increased, there is no possibility that the switching speed can be reduced when the resistive load is connected due to the fact that the gate potential of the MOS-type semiconductor device to be driven can be decreased down to the order of the threshold value of the first transfer MOSFET when a resistive load is connected.

In FIG. 1, there is shown an embodiment of a MOS-type semiconductor device drive circuit according to the invention, in which the same designations are given to parts shown in common with FIG. 2. According to the present circuit used to drive a MOSFET 1, a MOSFET 4 is connected between the source terminal 16 of a switching device 2 of a control circuit 14 and a ground potential. A Zener diode 51 and a diode 61 are connected in reverse series between a drain terminal 21 and a gate terminal 23 of MOSFET 4, and a Zener diode 52 and a diode 62 are connected in reverse series between gate terminal 23 and source terminal 22 of MOSFET 4. A resistor R₂ is connected in parallel to diode 62 and Zener diode 52. MOSFET 2, MOSFET 4, Zener diodes 51 and 52, and diodes 61 and 62 are integrated into a silicon substrate of MOSFET 1.

Figure 5:
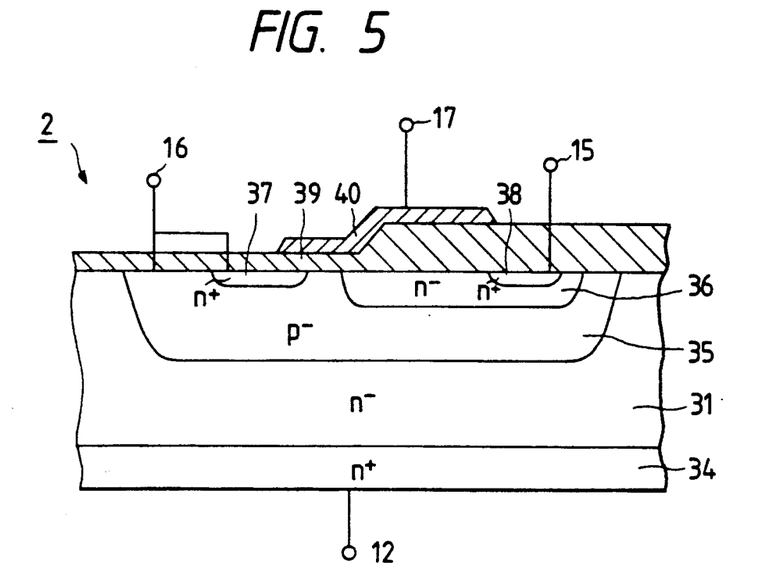
FIG. 5 is a sectional view of a MOSFET substrate incorporated in a control MOSFET.

In FIG. 5, there is shown a conceptual view of MOSFET 2, in which MOSFET 2 has an n⁻ type layer 36 formed in a surface portion of a p⁻ type layer 35 selectively formed in a surface portion of an n⁻ type layer 31 located on an n⁺ type layer 34 with which the drain electrode of MOSFET 1 is connectable. MOSFET 2 also has n⁺ type layers 37 and 38 respectively located in the surface portions of p⁻ type layer 35 and n⁻ type layer 36. In an area of p⁻ type layer 35 existing between n⁻ type layer 36 and n type layer 37, there is provided a gate electrode which is connected through an oxide film 39 to gate terminal 17. Terminal 15 is connected to n⁺ type layer 38, while terminal 16 is connected to n⁺ type layer 37 and p⁻ type layer 35.

Figure 6:
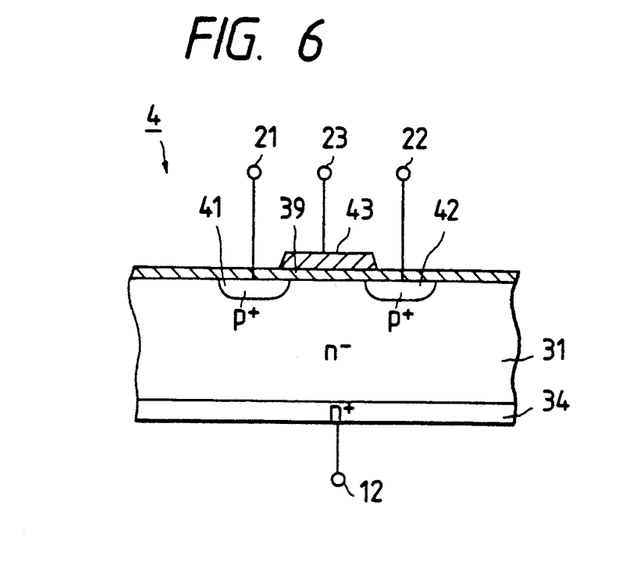
FIG. 6 is a sectional view of a MOSFET substrate incorporated in a current drawing MOSFET.

Referring now to FIG. 6, there is shown a conceptual view of MOSFET 4, in which a gate electrode 43 is provided in an oxide film 39 in an area existing between two p⁺ type layers 41 and 42 selectively formed in a surface portion of the n⁻ type layer 31. Terminals 21 and 22 are connected to p⁺ type layers 41 and 42, respectively, and gate terminal 23 is connected to gate electrode 43. N⁻ type layer 31 is cut off from terminals 21 and 22, and is connected through n+ type layer 34 to drain terminal 12 of MOSFET 1.

Figure 7:
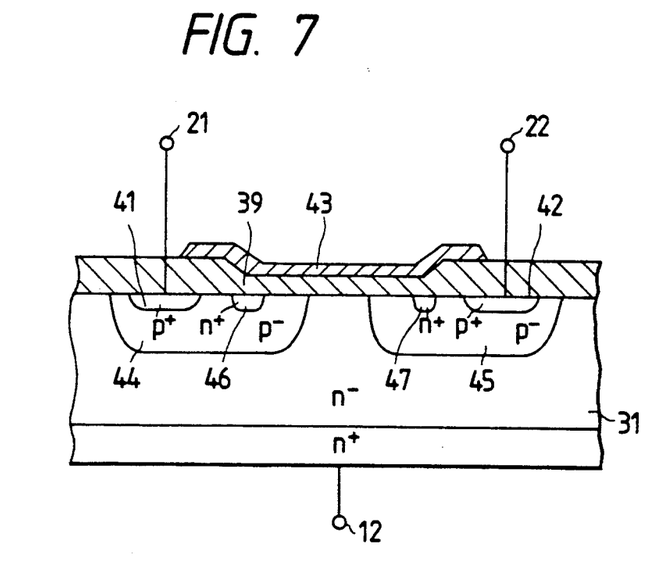
FIG. 7 is a sectional view of another embodiment of the MOSFET substrate incorporated in the current drawing MOSFET.
Figure 8:
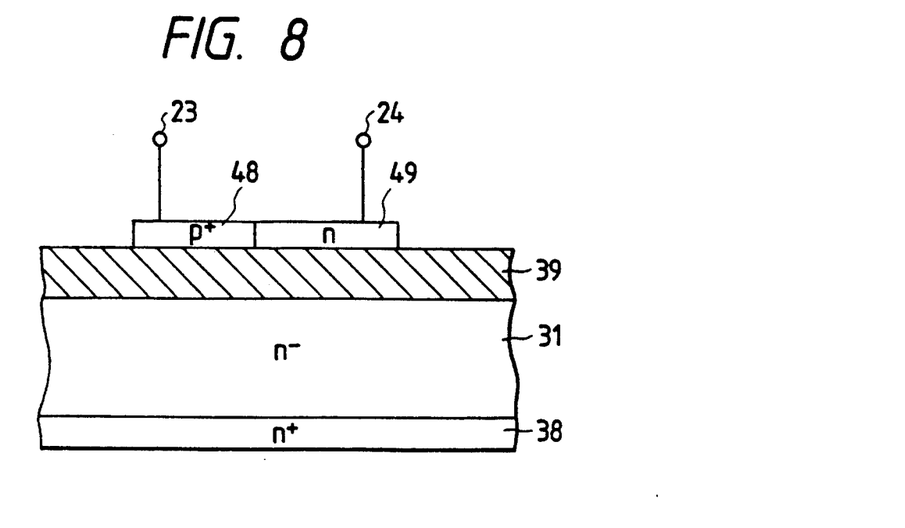
FIG. 8 is a sectional view of a MOSFET substrate including a Zener diode formed on the surface thereof.

In FIG. 7, there is shown a conceptual view of another embodiment of MOSFET 4. In this case, two p− type layers 44 and 45 are selectively formed in a surface portion of n− type layer 31, p+ type layer 41 and an n+ type layer 46 are formed in the surface portion of p− type layer 44, and p type layer 42 and an n+ type layer 47 are formed in a surface portion of p− type layer 45. Gate electrode 43 is provided on oxide film 39 in an area existing between n+ type layers 46 and 47. The threshold value of MOSFET 4 constructed in this manner is set to be 1 V or less with a bias effect included. The Zener diodes and diodes are, as shown in FIG. 3, provided in the silicon substrate. However, according to the invention, as shown conceptually in FIG. 8, the Zener diodes and diodes may be provided by forming a p+ type area 48 and an n type area 49 in a polycrystalline silicon layer provided on a $SiO_2$ film 39 which is formed on a substrate. In this manner, a drive circuit of a self separation type can be constructed in the same silicon substrate as MOSFET 1.

When turning on MOSFET 1 by use of the present drive circuit, if the potential of gate terminal 17 of MOSFET 2 is controlled to be ground potential or less to thereby turn off MOSFET 2, then gate terminal 13 of MOSFET 1 becomes a sufficiently higher potential than the threshold voltage necessary to turn on MOSFET 1. Then, a current flows to an inductive load connected to source terminal 11 of MOSFET 1. To turn off MOSFET 1, MOSFET 2 may be turned on. As shown in FIGS. 6 and 7, due to the fact that the substrate potential of MOSFET 4 as connected to drain terminal 12 of MOSFET 1 is high and thus MOSFET 4 is on due to the bias effect, there exists a first current path in which a current flows through resistor $R_1$ to source terminal 11, and a second current path in which a current flows through gate terminal 13, drain terminal 15, MOSFET 2, source terminal 16, terminal 21, MOSFET 4, and source terminal 22 to ground, so that the potential of gate terminal 13 of MOSFET 1 is suddenly reduced. Since the threshold value of MOSFET 4 is 1 V or less, a current flowing through the second current path is allowed to flow until a voltage drop across terminals 21 and 22 reaches about 1 V, thereby decreasing the potentials of terminals 13 and 21. When the potential of drain terminal 21 drops below the potential of source terminal 22, then MOSFET 4 is cut off. When the potential of drain terminal 21 is reduced along with the potential of gate terminal 13 and a difference between the potentials of the two ends 23 and 24 of Zener diode 51 exceeds the Zener voltage, then a current is allowed to flow through diode 61, Zener diode 51, and resistor $R_2$. If a high clamp voltage is necessary, then a plurality of Zener diodes are provided and connected in series with one another. For example, when the Zener diodes consist of three serially connected Zener diodes each having a Zener voltage of 10 V, the potential of drain terminal 21 is clamped at −30 V, that is, the potential of gate terminal 13 of MOSFET 1 is clamped. Unlike the load is inductive, when the load is resistive, the potential of source terminal 16 is dropped lower than the potential of source terminal 22 only by the approximate threshold value of MOSFET 4. For this reason, even if the three serially connected Zener diodes are employed in order to increase the clamp voltage, the potential of gate terminal 13 may not be held at a high level, but the threshold value of MOSFET 1 can be reduced to thereby provide improved controllability, so that switching speed can thus be increased.

Figure 9:
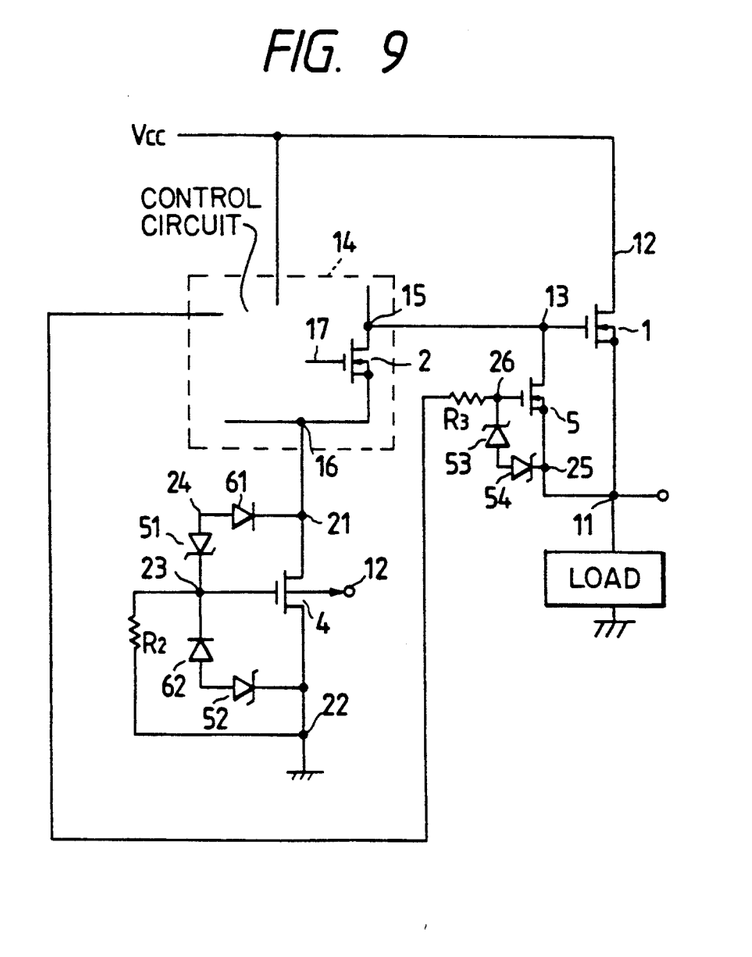
FIG. 9 is a circuit diagram of another embodiment of a MOSFET drive circuit according to the invention.

FIG. 9, shows another embodiment of the present invention, which is a modification of the embodiment shown in FIG. 1. In this embodiment, a drain terminal of a MOSFET 5 is connected to gate terminal 13 of MOSFET 1, a source terminal 25 of MOSFET 5 is connected to source terminal 11 of MOSFET 1, a gate terminal 26 of MOSFET 5 is connected through a resistor $R_3$ to the control circuit, and Zener diodes 53 and 54 are connected in reverse series in between gate terminal 26 and source terminal 25 of MOSFET 5. In this case, to turn on MOSFET 1, MOSFET 5 may be turned off and, to turn off MOSFET 1, a signal may be transmitted which can turn on MOSFET 5 synchronously with MOSFET 1. For this reason, this signal synchronizes a signal which is applied to gate terminal 17 of MOSFET 2. As a result, a current is allowed to flow through a path extending through drain terminal 15, gate terminal 13, MOSFET 5, source terminal 25, and source terminal 11. However, since a potential drop across terminals 13 and 12 is decreased when compared with the embodiment of FIG. 1 in which the current flows through resistor $R_1$, it is easier to control the threshold value. Also, since resistor $R_1$ is not needed, the size of the device can be reduced.

Figure 10:
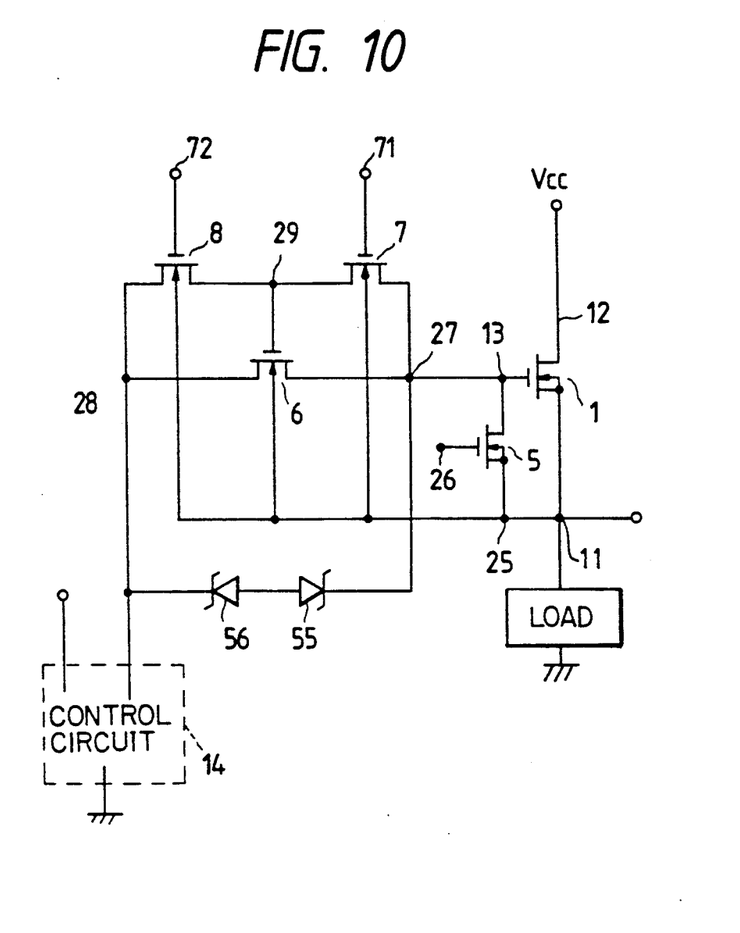
FIG. 10 is a circuit diagram of still another embodiment of a MOSFET drive circuit according to the invention.

Referring now to FIG. 10, there is shown a further embodiment of a MOS-type semiconductor device drive circuit according to the present invention. In this embodiment, source terminal 25 of MOSFET 5 is connected to source terminal 11 of MOSFET 1, and the drain terminal of MOSFET 5 is connected to gate terminal 13 of MOSFET 1. There is also provided a transfer MOSFET 6 having a drain terminal 27 connected to gate terminal 13 of MOSFET 1. Transfer MOSFET 6 also includes a source terminal 28, a gate terminal 29, and a substrate which is cut off from source terminal 28 and is connected to source terminal 11. This embodiment further includes a transfer MOSFET 7 including a drain connected to drain terminal 27, a source connected to gate terminal 29, a gate connected to a terminal 71, and a substrate which is cut off from the source thereof and is connected to source terminal 11. This embodiment further includes a transfer MOSFET 8 including a drain connected to gate terminal 29, a source connected to source terminal 28, a gate connected to a terminal 72, and a substrate which is cut off from the source thereof and is connected to source terminal 11. Zener diodes 55 and 56 are connected in reverse series between drain terminal 27 and source terminal 28 of transfer MOSFET 6.

To turn on MOSFET 1 by use of the drive circuit shown in FIG. 10, control circuit 14 may be operated to increase the potential of source terminal 28 up to a high level to thereby turn on transfer MOSFET 8 and turn off transfer MOSFET 7 and MOSFET 5. As a result, the potential of gate terminal 29 becomes high, transfer MOSFET 6 is allowed to conduct, and the potential of gate terminal 13 becomes high, so that MOSFET 1 is turned on to drive an inductive load connected to source terminal 11. To turn off MOSFET 1, the potential of source terminal 28 may be decreased, that is, be switched to ground potential by the control circuit 14 to thereby turn off transfer MOSFET 8 and turn on transfer MOSFET 7 and MOSFET 5. Since the electric charges of gate terminal 13 flow through MOSFET 5 to the inductive load and also since transfer MOSFET 7 is on, terminals 29 and 27 are higher in potential than source terminal 28 to thereby cause transfer MOSFET 6 to turn on, so that the current is allowed to flow through a path consisting of gate terminal 13, drain terminal 27, transfer MOSFET 6, and source terminal 28. When the potential of gate terminal 13 drops below the potential of source terminal 28, that is, ground potential, then transfer MOSFET 6 is cut off and the potential of gate terminal 13 continues to drop. When a difference between potentials across Zener diode 56 goes below the Zener voltage, then a current is allowed to flow through Zener diodes 55 and 56, so that the potential of gate terminal 13 is clamped. The clamp voltage of Zener diode 56 can be set for 30 to 50 V by connecting a plurality of Zener diodes in series. Similarly, as in the previously described embodiment, even when a resistive load is connected to source terminal 11, the potential of gate terminal 13 can be decreased down to the approximate threshold value of transfer MOSFET 6. And, even if transfer MOSFET 8 is replaced by a resistor, a similar effect can be provided. Also, Zener diode 55 may be replaced by an ordinary diode.

In the above-mentioned embodiments, MOSFET 1 is used as a MOS-type semiconductor device. Alternatively, an IGBT may be used in place of MOSFET 1. Also, by changing the conductive types of the respective devices, that is, by switching the n types to p types or the p types to n types, or by reversing the positive and negative polarities of the potentials, the present invention can apply also when p channel devices are used.

According to the invention, by using a Zener diode connected in parallel to a MOSFET in order to clamp the variations of a gate potential when turning off a MOS-type semiconductor device connected to an inductive load, it is possible to construct a drive circuit which can reduce the gate potential down to a small value when turning off the same MOS-type semiconductor device when connected to a resistive load, even when Zener diodes are connected in series to provide a deep clamp voltage so that MOSFET or IGBT can be switched at higher speeds.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A circuit for driving a MOS-type semiconductor device having a source, a gate, and a drain, said circuit comprising:
   a MOSFET including a source, a gate, and a drain which is connected through a control circuit to the gate of the MOS-type semiconductor device to be driven;
   a Zener diode;
   a diode connected to said Zener diode in reverse series between the gate and the drain of said MOSFET; and
   a resistor connected between the gate and the source of said MOSFET.

2. The circuit of claim 1, further comprising a second resistor connected between the gate of the MOS-type semiconductor device and a terminal to which a load is connected.

3. The circuit of claim 2, wherein the load is a resistive load.

4. The circuit of claim 2, wherein the load is an inductive load.

5. The circuit of claim 1, further comprising a switching device connected between the gate of the MOS-type semiconductor device and a terminal to which a load is connected.

6. The circuit of claim 5, wherein the load is a resistive load.

7. The circuit of claim 5, wherein the load is an inductive load.

8. The circuit of claim 5, wherein said switching device is a second MOSFET including a gate, a drain connected to the gate of the MOS-type semiconductor device to be driven, and source connected to the terminal to which the load is connected.

9. The circuit of claim 8, further comprising a second Zener diode, and a second diode connected to said second Zener diode in reverse series between the gate and the source of said MOSFET.

10. The circuit of claim 9, further comprising a third Zener diode, and a fourth Zener diode connected to said third Zener diode in reverse series between the gate and the source of said second MOSFET.

11. The circuit of claim 1, wherein the MOS-type semiconductor device to be driven is a MOSFET.

12. The circuit of claim 1, wherein the MOS-type semiconductor device to be driven is an IGBT.

13. The circuit of claim 1, further comprising a second Zener diode, and a second diode connected to said second Zener diode in reverse series between the gate and the source of said MOSFET.

14. A circuit for driving a MOS-type semiconductor device having a source, a gate and a drain, said circuit comprising:
   a MOSFET including a source, a gate, and a drain which is connected through a control circuit to the gate of the MOS-type semiconductor device to be driven;
   a Zener diode;
   a diode connected to said Zener diode in reverse series between the gate and the drain of said MOSFET; and
   a switching device connected between the gate of the MOS-type semiconductor device to be driven and a terminal to which a load is connected.

15. The circuit of claim 14, further comprising a second Zener diode, and a second diode connected to said second Zener diode in reverse series between the gate and the source of said MOSFET.

16. The circuit of claim 14, further comprising a resistor connected between the gate and the source of said MOSFET.

17. The circuit of claim 14, wherein said switching device is a second MOSFET including a gate, a drain connected to the gate of the MOS-type semiconductor device to be driven, and source connected to the terminal to which the load is connected.

18. The circuit of claim 14, further comprising a third Zener diode, and a fourth Zener diode connected to said third Zener diode in reverse series between the gate and the source of said second MOSFET.

19. The circuit of claim 14, wherein the MOS-type semiconductor device to be driven is a MOSFET.

20. The circuit of claim 14, wherein the MOS-type semiconductor device to be driven is an IGBT.

21. The circuit of claim 14, wherein the load is a resistive load.

22. The circuit of claim 14, wherein the load is an inductive load.

23. A circuit for driving a MOS-type semiconductor device having a source, a gate, and a drain, said circuit comprising:
- a first transfer MOSFET including a gate, a source connected to a control circuit, and a drain which is connected to the gate of the MOS-type semiconductor device to be driven;
- a pair of Zener diodes connected in reverse series between the source and the drain of said first transfer MOSFET;
- a second transfer MOSFET including a source connected to the gate of said first transfer MOSFET, and a drain which is connected to the drain of said first transfer MOSFET;
- a third transfer MOSFET including a source connected to the source of said first transfer MOSFET, and a drain which is connected to the gate of said first transfer MOSFET; and
- a switching device connected between the gate of the MOS-type semiconductor device to be driven and a terminal to which a load is connected.

24. The circuit of claim 23, wherein the MOS-type semiconductor device to be driven is a MOSFET.

25. The circuit of claim 23, wherein the MOS-type semiconductor device to be driven is an IGBT.

26. The circuit of claim 23, wherein the load is a resistive load.

27. The circuit of claim 23, wherein the load is an inductive load.

* * * * *